United States Patent
Uzoh et al.

(10) Patent No.: US 9,064,933 B2
(45) Date of Patent: Jun. 23, 2015

(54) METHODS AND STRUCTURE FOR CARRIER-LESS THIN WAFER HANDLING

(71) Applicant: Invensas Corporation, San Jose, CA (US)

(72) Inventors: Cyprian Emeka Uzoh, San Jose, CA (US); Pezhman Monadgemi, Fremont, CA (US); Michael Newman, Dublin, CA (US); Charles G. Woychik, San Jose, CA (US); Terrence Caskey, Santa Cruz, CA (US)

(73) Assignee: Invensas Corporation, San Jose, CA (US)

(*) Notice: Subject to any disclaimer, the term of this patent is extended or adjusted under 35 U.S.C. 154(b) by 27 days.

(21) Appl. No.: 13/724,223

(22) Filed: Dec. 21, 2012

(65) Prior Publication Data
US 2014/0179099 A1  Jun. 26, 2014

(51) Int. Cl.
*H01L 21/4763* (2006.01)
*H01L 21/768* (2006.01)
*H01L 21/78* (2006.01)
*H01L 21/56* (2006.01)
*H01L 23/48* (2006.01)

(52) U.S. Cl.
CPC ........ *H01L 21/76841* (2013.01); *H01L 21/768* (2013.01); *H01L 21/76898* (2013.01); *H01L 21/78* (2013.01); *H01L 21/561* (2013.01); *H01L 23/481* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 3,936,329 A | 2/1976 | Kendall et al. | |
| 6,074,948 A | 6/2000 | Nagai | |
| 6,884,717 B1 | 4/2005 | Desalvo et al. | |
| 2002/0047210 A1 | 4/2002 | Yamada et al. | |
| 2006/0046438 A1 | 3/2006 | Kirby | |
| 2007/0045836 A1* | 3/2007 | Kwon et al. | 257/734 |
| 2007/0190692 A1 | 8/2007 | Erturk et al. | |
| 2008/0079152 A1 | 4/2008 | Tanaka et al. | |
| 2013/0217188 A1* | 8/2013 | Wang et al. | 438/118 |

FOREIGN PATENT DOCUMENTS

| | | |
|---|---|---|
| WO | 2009045859 A1 | 4/2009 |
| WO | 2010147028 A1 | 12/2010 |

OTHER PUBLICATIONS

International Search Report and Written Opinion for Application No. PCT/US2013/076137 dated Jul. 21, 2014.

* cited by examiner

*Primary Examiner* — Charles Garber
*Assistant Examiner* — Brigitte Paterson
(74) *Attorney, Agent, or Firm* — Lerner, David, Littenberg, Krumholz & Mentlik, LLP

(57) ABSTRACT

Methods of forming a microelectronic assembly and the resulting structures and devices are disclosed herein. In one embodiment, a method of forming a microelectronic assembly includes removing material exposed at portions of a surface of a substrate to form a processed substrate having a plurality of thinned portions separated by integral supporting portions of the processed substrate having a thickness greater than a thickness of the thinned portions, at least some of the thinned portions including a plurality of electrically conductive interconnects extending in a direction of the thicknesses of the thinned portions and exposed at the surface; and removing the supporting portions of the substrate to sever the substrate into a plurality of individual thinned portions, at least some individual thinned portions including the interconnects.

15 Claims, 13 Drawing Sheets

METHODS AND STRUCTURE FOR CARRIER-LESS THIN WAFER HANDLING

FIELD OF THE INVENTION

The present application relates to methods of forming a microelectronics assembly including removing material exposed at portions of a surface of the substrate to form a processed substrate having a plurality of thinned portions separated by integral support portions having a thickness greater than a thickness of the thinned portions, and removing at least portions of the supporting portions to sever the substrate into a plurality of individual thinned portions.

BACKGROUND OF THE INVENTION

Substrate processing can require a substrate to be temporarily coupled to a carrier substrate. For example, such temporary coupling may be necessary to support the substrate during processing, such as when material is removed from the substrate by mechanical means such as grinding, for example, or in any such process where the substrate lacks sufficient mechanical strength to support its own weight.

Unfortunately, bonding and de-bonding methods have several limitations. For example, some methods can require specialized bonding material and debonding tools that are available only from limited sources. In some cases, the conditions, e.g., heat or pressure that must be applied to debond are not easily integrated with other processing applied to the substrate and may cause cracks or induce stress in the device substrate. In some cases, specialized carrier substrates are required.

Unfortunately, these methods may add to the cost of substrate processing due to need for specialized bonding materials, carrier substrates, and/or expensive de-bonding equipment, low throughput that may result from these specialized materials and/or equipment, or additional processing steps associated with using a carrier substrate.

Thus, improved methods of forming a microelectronics assembly provided herein.

BRIEF SUMMARY OF THE INVENTION

Methods of forming a microelectronics assembly and the resulting structures and devices are disclosed herein. In one embodiment, a method of forming a microelectronic assembly includes removing material exposed at portions of a surface of a substrate to form a processed substrate having a plurality of thinned portions separated by integral supporting portions of the processed substrate, the processed substrate having a thickness greater than a thickness of the thinned portions, at least some of the thinned portions including a plurality of electrically conductive interconnects extending in a direction of the thicknesses of the thinned portions and exposed at the surface; and removing the supporting portions of the substrate to sever the substrate into a plurality of individual thinned portions, at least some individual thinned portions including the interconnects.

In one embodiment, the substrate consists essentially of semiconductor material, the method further comprising forming a dielectric layer overlying the surface of the thinned portions prior to the step of removing the supporting portions.

In one embodiment, the substrate consists essentially of dielectric material and insulates the interconnects from one another.

In one embodiment, the method further comprises forming the substrate by steps including bonding confronting surfaces of first and second elements with one another and forming the interconnects extending through the first element, wherein the step of removing material of the substrate includes removing the material of the second element exposed at the portions of the surface to cause the electrically conductive interconnects to become exposed at the surface.

In one embodiment, at least some of the thinned portions include a plurality of active devices.

In one embodiment, the method further comprises forming an electrically conductive structure contacting at least some of the interconnects prior to the step of removing the supporting portions, wherein the electrically conductive structure is exposed at the surface.

In one embodiment, the conductive structure includes a bond metal.

In one embodiment, the forming of the conductive structure includes forming contacts at least partially exposed at a surface of the dielectric region.

In one embodiment, during the step of removing material at the surface of the substrate, at least some of the thinned regions are formed so as to leave supporting portions surrounding the at least some thinned regions.

In one embodiment, the step of removing the supporting portions further comprises sawing at least one first supporting portion of the substrate in a first direction and sawing at least one second supporting portion of the substrate in a second direction transverse to the first direction.

In one embodiment, a method of forming a microelectronic assembly includes removing material exposed at portions of a surface of a substrate to form a processed substrate having a plurality of thinned portions separated by integral supporting portions of the processed substrate, the supporting portions having a thickness greater than a thickness of the thinned portions, the thinned portions including electrically conductive interconnects extending in a direction of the thickness of the thinned portions and exposed at the surface; forming a dielectric layer on the thinned portions; forming openings extending through the dielectric layer, the interconnects being exposed within the openings; depositing an electrically conductive material within the openings; and removing material overlying at least the supporting portions of the processed substrate so as to planarize a surface of the dielectric layer relative to at least one of the supporting portions or material of the processed substrate overlying the supporting portions.

In one embodiment, prior to the step of depositing the electrically conductive material, further comprises depositing a metal layer overlying the dielectric layer and in conductive communication with the interconnects, wherein the metal layer comprises at least one of an adhesion layer or a barrier layer or a seed layer.

In one embodiment, depositing the electrically conductive material further comprises depositing the electrically conductive material on the surfaces of the metal layer and within the openings.

In one embodiment, forming the dielectric layer further comprises forming a dielectric passivation layer overlying the surface of the thinned portions; and forming a second dielectric layer overlying the surfaces of the dielectric passivation layer.

In one embodiment, the method further comprises removing at least portions of the supporting portions of the substrate to sever the substrate into a plurality of individual thinned portions, the individual thinned portions including the interconnects.

In one embodiment, prior to removing the at least portions of the supporting portions, the method further comprises depositing a bond metal material above the surfaces of the electrically conductive material to form substrate contacts, wherein the bond metal material is in conductive communication with the electrically conductive material.

In one embodiment, prior to depositing the bond metal material, further comprises depositing a metal material overlying the surfaces of the electrically conductive material.

In one embodiment, prior to the step of removing the at least portions of the supporting portions, the method further comprises juxtaposing contacts at a surface of a microelectronic element with substrate contacts of the processed substrate and joining the contacts with the juxtaposed substrate contacts, wherein the substrate contacts are disposed above the surfaces of the electrically conductive material and in conductive communication with the electrically conductive material.

In one embodiment, forming the dielectric layer further comprises forming a dielectric passivation layer overlying the surface of the thinned portions; and forming a second dielectric layer overlying the surfaces of the dielectric passivation layer.

In one embodiment, the method further comprises removing the second dielectric layer after the openings are formed and prior to depositing the electrically conductive material.

In one embodiment, depositing the electrically conductive material further comprises depositing the electrically conductive material above the dielectric passivation layer and within the openings.

In one embodiment, prior to depositing the electrically conductive material, the method further comprises depositing a metal layer overlying the dielectric passivation layer and in conductive communication with the interconnects, wherein the metal layer comprises at least one of an adhesion layer or a barrier layer or a seed layer.

In one embodiment, the methods further comprises forming a third dielectric layer overlying the electrically conductive material; forming second openings extending through the third dielectric layer, the second openings overlying a portion of the electrically conductive material between the interconnects; and removing the portion of the electrically conductive material exposed within the second openings to electrically isolate the interconnects from one another.

In one embodiment, the method further comprises removing the third dielectric layer after removing the portion of the electrically conductive material In one embodiment, the method further comprises removing the supporting portions of the substrate to sever the substrate into a plurality of individual thinned portions including the interconnects.

In one embodiment, during the step of removing material at the surface of the substrate, at least some of the thinned regions are formed so as to leave supporting portions surrounding the at least some thinned regions.

In one embodiment, the step of removing the supporting portions further comprises sawing at least one first supporting portion of the substrate in a first direction and sawing at least one second supporting portion of the substrate in a second direction transverse to the first direction.

BRIEF DESCRIPTION OF THE DRAWINGS

FIG. 1-1 depicts a side schematic view of a processed substrate in accordance with some embodiments of the present invention.

FIGS. 9F-1 depicts a microelectronic assembly in accordance with some embodiments of the present invention.

DETAILED DESCRIPTION

Methods for forming a microelectronics assembly are disclosed herein. The inventive methods, in some cases, can use conventional or widely available products and methods, such as etching, dicing/sawing, and the like. In many cases, conventional equipment, such as deposition chambers, etch chambers or the like can be used in the inventive methods disclosed herein to form a microelectronics assembly. Other and further characteristics or advantages of the inventive methods are discussed herein.

Figure 1:
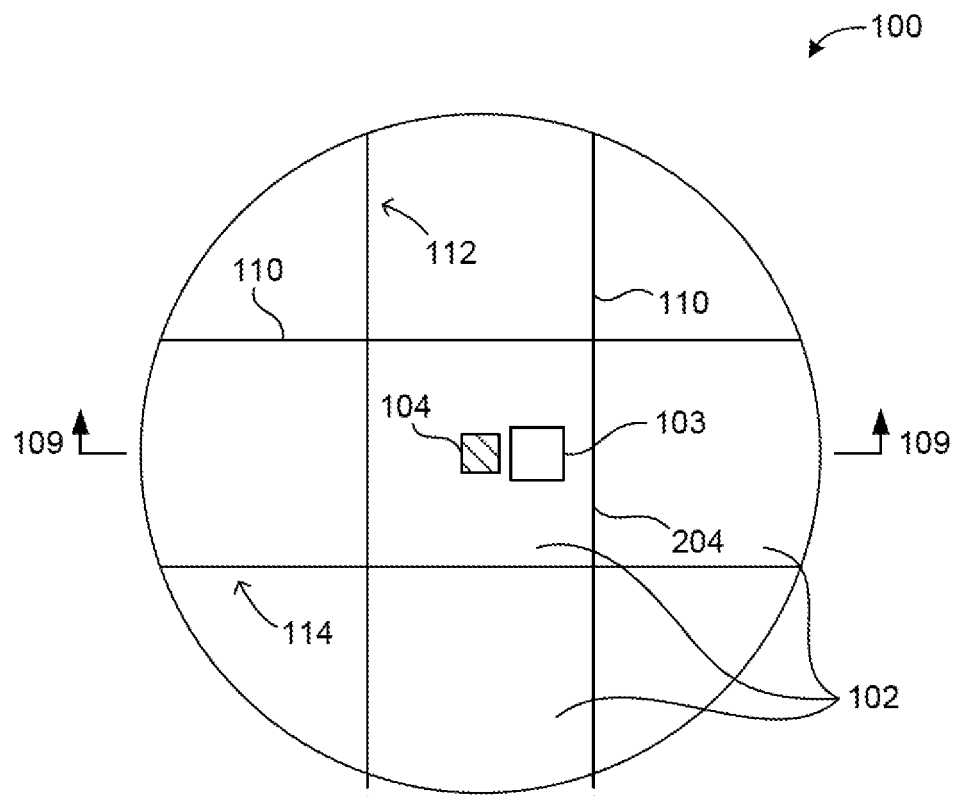
FIG. 1 depicts top down view of a processed substrate in accordance with some embodiments of the present invention.
Figure 1:
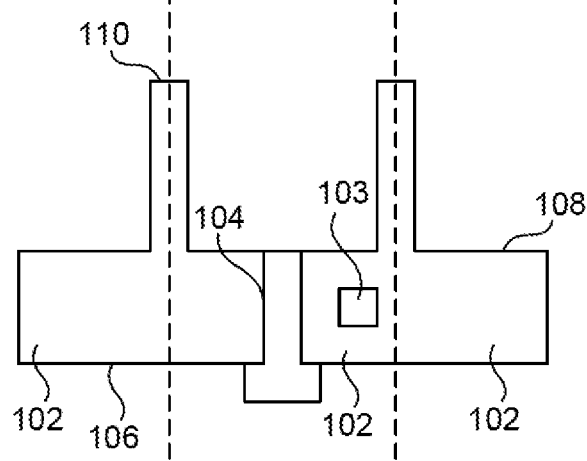

FIGS. 1 and 1-1 depict an exemplary processed substrate 100 in a top down view and a corresponding cross sectional view through line 109-109, respectively. The methods of the present invention may include formation of and/or utilization of one or more embodiments of the exemplary processed substrate 100. For example, the processed substrate 100 may be a semiconductor wafer, having a 200 mm, 300 mm, or other diameters. Although depicted as round, the device substrate may have any suitable shape. The processed substrate 100 may include or consist essentially of one or more semiconductor or dielectric materials, such as silicon (Si), silicon dioxide ($SiO_2$), glass, Group III-V materials such as gallium arsenide (GaAs) and gallium nitride (GaN), Group IV materials such as silicon carbide (SiC) or silicon germanium (SiGe), and may have amorphous, monocrystalline, or polycrystalline or other structure.

The processed substrate 100 may include a plurality of thinned portions 102, each of which may be or include a semiconductor chip, one or more interconnect structures, of the like, the thinned portions 102 being integral portions of a wafer, for example. Each thinned portion 102 may have one or more circuit elements 103 thereon. The circuit elements 103 may be active, passive, or combinations thereof. As seen in the cross sectional view in FIG. 1-1, each circuit element 103 typically has at least a portion extending within a semiconductor region of the processed substrate 100 between a first surface 106 and an opposite second surface 108 of the thinned portion 102. In some embodiments, an active circuit element 103 may be one or more of a transistor, diode, or other suitable active circuit elements on the thinned portion 102. In some embodiments, a passive circuit element 103 may include a capacitor, resistor, inductor, or the like. Alternatively, or in combination, each thinned portion 102 may include one or more electrically conductive interconnects 104 extending in a direction of thickness of the thinned portion 102 and, in some instances, along lateral surfaces thereof, such as with conductive traces, lines, surface-disposed electronic components or the like. As illustrated in FIG. 1-1, a partially formed interconnect 104 is illustrated extending from the first surface 106 in a direction of thickness of the thinned portion 102 towards the second surface 108, where the interconnect 104 is exposed at the second surface 108. As used in this disclosure with reference to a substrate, a statement that an electrically conductive element is "at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, an interconnect or other conductive element which is at a surface of a substrate may project from such surface; may be flush with such surface; or may be recessed relative to such surface in a hole or depression in the substrate.

The thinned portions 102 of the processed substrate 100 may be distinguished by integral supporting portions 110 of the processed substrate 100 having thickness greater than the thickness of the thinned portions 102. As illustrated in FIG. 1, at least some of the thinned portions 102 may be surrounded by respectively supporting portion. In one embodiment, the supporting portions may extend along first axes 112 in a first direction aligned with at least some of the supporting portions 110 and along second axes 114 in a second direction transverse to the first direction and aligned with at least some of the supporting portions 110. However, such a configuration of the supporting portions 110 is merely exemplary and other embodiments are possible. For example, the configuration of the supporting portions 110 may be any suitable configuration which supports the processed substrate 100 during processing, and provides sufficient support to limit the substrate 100 from deflecting substantially under its own weight.

Figure 2:
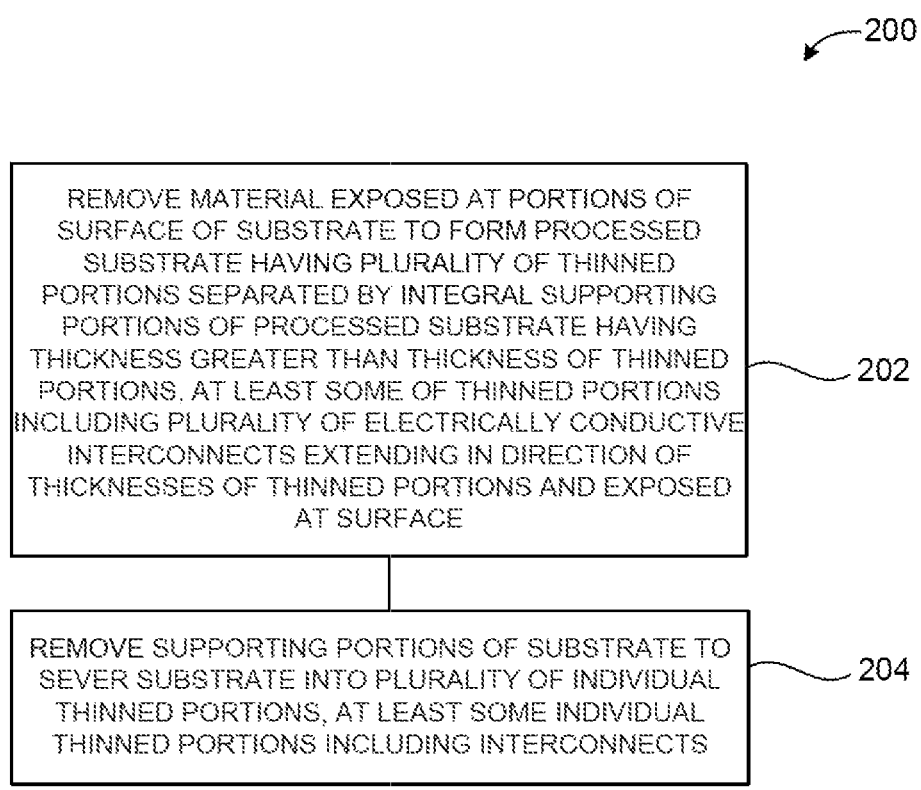
FIG. 2 depicts a flow chart for a method of forming a microelectronic assembly in accordance with some embodiments of the present invention.

FIG. 2 depicts a flow chart of a method 200 for formation of a microelectronics assembly in accordance with some embodiments of the present invention. The method 200 is described in accordance with exemplary processes depicted in FIGS. 3-5.

FIGS. 3A-G depict an exemplary process which may include embodiments of the method 200. The exemplary process as depicted in FIGS. 3A-G discloses the stages of formation of an interconnect structure using a masking process. For example, a substrate 300 may include one of a semiconductor material, such as silicon and/or other semiconductor materials, or a dielectric material, such as glass and/or other dielectric materials.

Figure 3A:
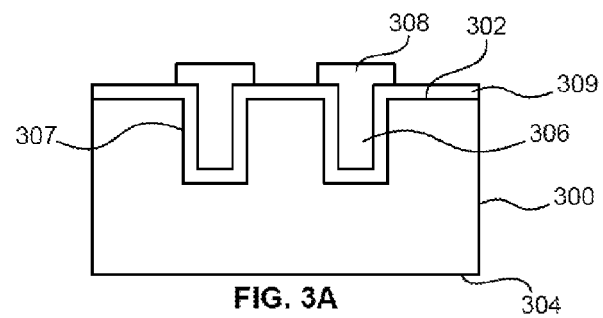
FIGS. 3A-G depict the stages of forming a microelectronic assembly in accordance with some embodiments of the present invention.

FIG. 3A depicts the substrate 300 having a first surface 302 and opposing second surface 304. The substrate 300 includes one or more electrically conductive interconnects 306 extending in a direction of thickness of the substrate 300 from the first surface 302 towards the second surface 304. The substrate 300 may have a thickness ranging typically from about 200 to about 1000 microns. As illustrated in FIG. 3A, one or more electrically conductive contacts 308 may be formed at the first surface 302, each contact 308 in electrically communication with a corresponding interconnect 306. The interconnects 306 may disposed in openings 307, the openings 307 extending in a direction of thickness of the substrate 300. Prior to forming the interconnects 306, a layer 309 may be formed. The layer 309 may be overlying the first surface 302 and lining the surfaces of the openings 307. The layer 309 may include one or more of a dielectric layer, a barrier layer, wiring feature layer, adhesive layer, or combinations thereof. The layer 309 may comprise materials, such as silicon dioxide ($SiO_2$), silicon nitride (SiN), alumina, titanium (Ti), titanium nitride (TiN), tantalum (Ta), tantalum nitride (TiN), Ta/TaN, nickel phosphorus (NiP), nickel boron (NiB), cobalt phosphorus (CoP), copper (Cu), nickel (Ni), or other materials. In one embodiment, the layer 410 may be conductive, for example, ranging from about 1.7 to about 300 microohm-centimeters ($\mu$ohm-cm). In one embodiment, the layer 309 may be a dielectric layer and comprise $SiO_2$. In one embodiment, the contacts 308 can be bond pads having connections to the interconnects 306 through back end of line (BEOL) wiring layers within interlayer dielectric (ILD) layers overlying the first surface 302 of the substrate 300.

Figure 3B:
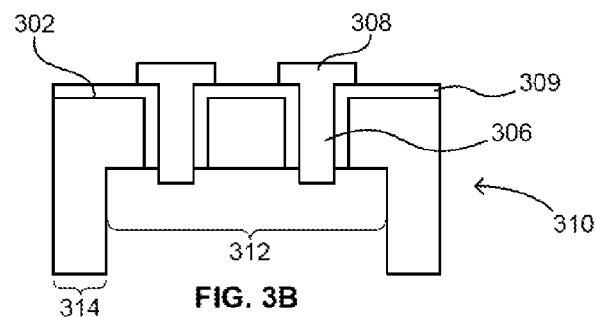
Figure 3C:
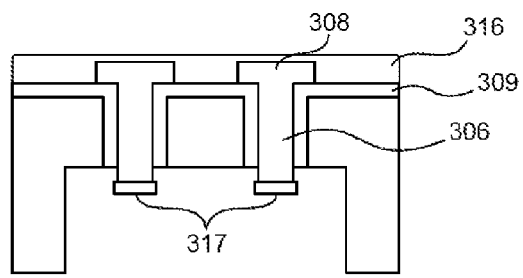

At 202, shown in FIG. 2, material exposed at portions of the second surface 304 may be removed to form a processed substrate 310 as depicted in FIG. 3B. The processed substrate 310 may include a plurality of thinned portions 312 (one such portion is shown in FIG. 3B) separated by integral supporting portions 314 of the processed substrate 310 having a thickness greater than the thickness of the thinned portions 312. Upon removal of material at portions of the second surface 304, the interconnects 306 may be exposed at the second surface 304 as depicted in FIG. 3B. The removal of material may be performed by any suitable processes, such as reactive ion etch (RIE) processes, or the like.

After removal of material at 202, one or more protective layers may be deposited to protect exposed surfaces of electrically conductive materials, such as surfaces of the contacts 308, and/or exposed surfaces of the interconnects 306 at the second surface 304. For example, a protective layer 316 may be deposited on the first surface 302 to protect the contacts 308. The protective layer 316 may include one or more materials and/or layers of materials, such a polymeric material, a dielectric material, an oxide, a nitride, combinations thereof, or laminates thereof. The protective layer 316 may be formed by spin coating, lamination, or other suitable methods. For example, a protective layer 317 may be deposited on exposed surfaces of the interconnects 306 at the second surface 304. The protective layer 317 may include one or more materials and/or layers of materials discussed above with regards to the protective layer 316. Alternatively, or in combination, the protective layer 317 may include a conductive material overlying the interconnects 306 at the second surface 304. For example, the conductive material may include one or more of nickel (Ni), gold (Au), nickel alloys, gold alloys, nickel phosphorus (NiP), electroless nickel immersion gold (ENIG), or the like. In one embodiment, the protective layer 317 may range in thickness from about 500 to about 2000 Angstroms. In one embodiment, the protective layer 317 including the conductive material may protect the interconnects 306 at the second surface 304, for example, during removal of a resist layer, such as in embodiments wherein the protective layer 316 includes a resist layer or is a resist layer.

Figure 3D:
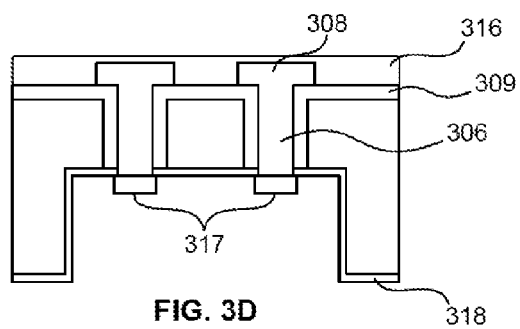

With the protective layers 316, 317 covering the exposed surfaces of the electrically conductive materials, a dielectric layer 318 may be formed overlying the second surface 304 of the thinned portions 312 as depicted in FIG. 3D. The dielectric layer 318 may also be formed overlying surfaces of the support portions 314 as illustrated in FIG. 3D. The dielectric layer 318 can be formed by any suitable method, such as sputtering, plasma enhanced chemical vapor deposition (PECVD), or the like. The dielectric layer 318 may include one or more materials, such as polymeric materials, oxides, nitrides, or combinations thereof.

Figure 3E:
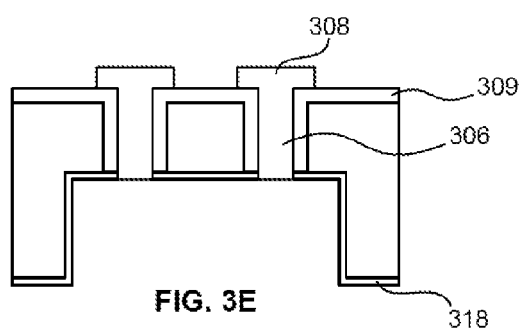
Figure 3F:
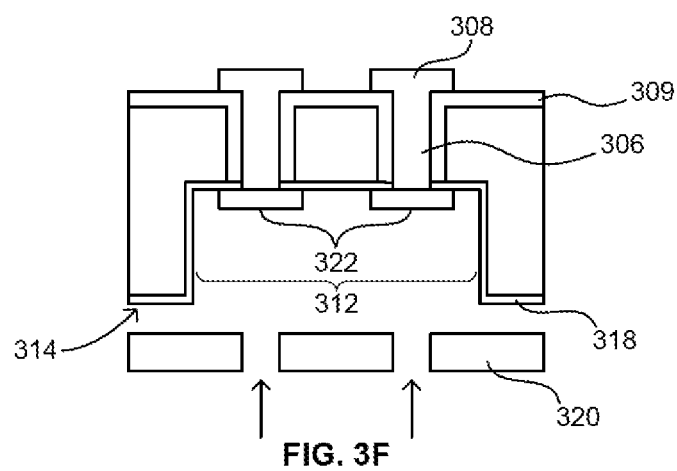

After formation of the dielectric layer 318, the protective layer 316 may be removed, exposing the interconnects 306 at the second surface 304 as depicted in FIG. 3E. In one embodiment, a shadow mask 320 may be utilized to form an electrically conductive structure 322 at at least some of the interconnects 306 at the second surface 304. As shown in FIG. 3F, after the electrically conductive structure 322 is formed, the interconnects 306 remain electrically insulated from each other.

Figure 3G:
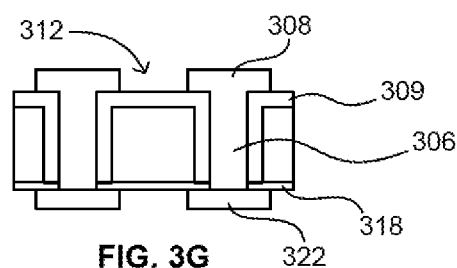

At 204, the supporting portions 314 can be partially or fully removed to sever the substrate 310 into a plurality of individual thinned portions 312, one of which is depicted in FIG. 3G. As shown, at least some of the individual thinned portions 312 may include the interconnects 306. For example, as shown in FIG. 3G, the supporting portions 314 are fully removed. However, in some embodiments, such as illustrated in FIGS. 8 and 9 and discussed below, even when the substrate is severed by dicing or the like, a portion of the supporting portions can remain. For example, the portion of the supporting portions that remain in an individual thinned portion can improve the rigidity and/or flatness of the individual thinned portion.

Alternative to the masking process depicted in FIGS. 3A-G, the method 200 may be utilized with a maskless process. For example, FIGS. 4A-E depict an exemplary process which may include embodiments of the method 200. The exemplary process as depicted in FIGS. 4A-E discloses the stages of formation of an interconnect structure using a maskless process. For example, a substrate 400 may include one of a semiconductor material, such as silicon and/or other semiconductor materials, or a dielectric material, such as glass and/or other dielectric materials.

Figure 4A:
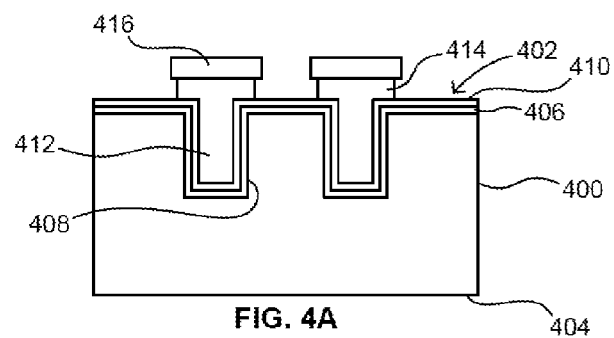
FIGS. 4A-E depict the stages of forming a microelectronic assembly in accordance with some embodiments of the present invention.

FIG. 4A depicts the substrate 400 having a first surface 402 and opposing second surface 404. The substrate 400 includes one or more openings 408 extending in a direction of thickness of the substrate 400 from the first surface 402 towards the second surface 404. The openings 408 may be exposed at the first surface 402. The substrate 400 may have a thickness typically ranging from about 200 to about 1000 microns. As illustrated in FIG. 4A, a dielectric layer 406 may be overlying the first surface 402 and the surfaces of the openings 408. A layer 410, which can include one or more of a barrier layer, adhesive layer, or combinations thereof, may be overlying the dielectric layer 406 and the surfaces of the openings 408. The layer 410 may comprise materials, such as silicon nitride (SiN), alumina, titanium (Ti), titanium nitride (TiN), tantalum (Ta), tantalum nitride (TiN), Ta/TaN, nickel phosphorus (NiP), nickel boron (NiB), cobalt phosphorus (CoP), or other materials. In one embodiment, the layer 410 may be conductive, for example, ranging from about 1.7 to about 300 microohm-centimeters (μohm-cm). Disposed in the openings 408 and overlying the surfaces of the layer 410 within the openings 408 may be interconnects 412. The interconnects 412 may be formed from a conductive materials, such as a metal. For example, in one embodiment, the interconnects 412 may include tungsten (W), and the layer 410 may be one of Ti, TiN, or a combination thereof, and in a particular example may be Ti/TiN/Ti. In high temperature applications, the interconnects 412 can be made of polysilicon, where the layer 410 can be omitted from the openings 408, and the dielectric layer 406 may include silicon oxide ($SiO_2$). Overlying the interconnects 412 and portions of the layer 410 may be electrically conductive contacts 414, each contact 414 in electrical communication with a corresponding interconnect 412. The contacts 414 may be capped with a capping layer 416. The capping layer 416 may be formed from the same material as the layer 410 or another suitable material to cover the surfaces of the contacts. Similar to the contacts 308, in one embodiment, the contacts 414 can be bond pads having connections to the interconnects 412 through back end of line (BEOL) wiring layers within interlayer dielectric (ILD) layers overlying the first surface 402 of the substrate 400.

Figure 4B:
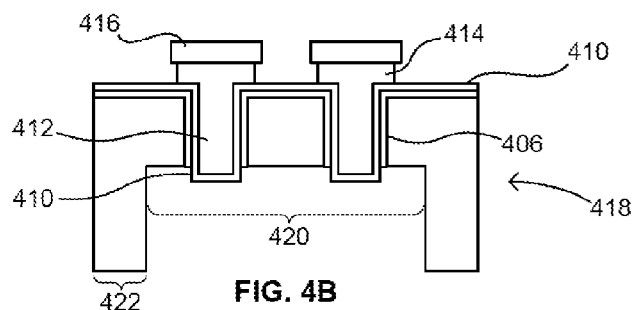

Similar to the method described above with reference to step 202, material exposed at portions of the second surface 404 may be removed to form a processed substrate 418 as depicted in FIG. 4B. The processed substrate 418 may include a plurality of thinned portions 420 (one such portion is shown in FIG. 4B) separated by integral supporting portions 422 of the processed substrate 418 having a thickness greater than the thickness of the thinned portions 420. Upon removal of material at portions of the second surface 404, barrier layer 410 lining the openings 408 may be exposed at the second surface 404 as depicted in FIG. 4B. The removal of material may be performed by any suitable processes, such as reactive ion etch (RIE) processes, or the like.

Figure 4C:
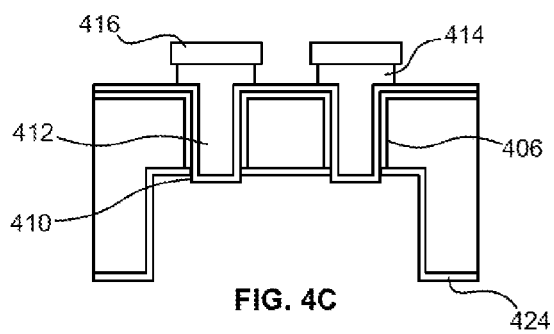

After removal of the material to form the processed substrate 418, a dielectric layer 424 may be formed overlying the second surface 404 of the thinned portions 420 as depicted in FIG. 4C. The dielectric layer 424 may also be formed overlying surfaces of the support portions 422 as illustrated in FIG. 4C. As illustrated in FIG. 4C, the dielectric layer 424 does not form on the barrier layer 410, or any barrier layer-like material, such as that used to form the capping layer 416. For example, in one embodiment, the dielectric layer 424 may be deposited using sputtering, plasma-enhanced chemical vapor deposition (PECVD), spin coating or similar process.

Figure 4D:
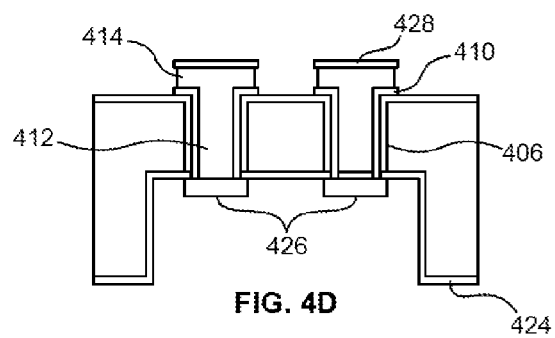

After formation of the dielectric layer 424, a removal step may be implemented to remove the capping layer 414, and exposed portions of the barrier layer 410 at the first and second surfaces 402, thereby exposing the interconnects 412 at the second surface 404 and the contacts 414 at the first surface 402. Electrically conductive structures 426, 428 may be formed at at least some of the interconnects 412 at the second surface 404 and at at least some of the contacts 428, respectively, the conductive structures 426, 428 in electrically communication with the interconnects 412. As shown in FIG. 4D, after the electrically conductive structures 426, 428 are formed, the interconnects 412 remain electrically insulated from each other. According to one implementation, at least some of the interconnects 412 may be electrically coupled through a redistribution layer (RDL) disposed on or within the substrate 418.

Figure 4E:
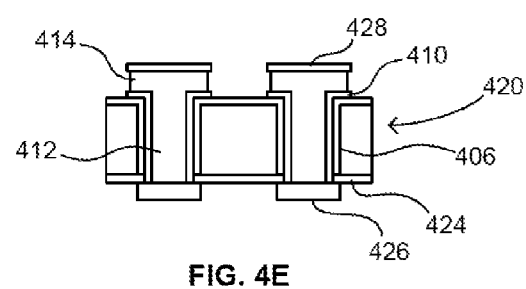

Similar to the method described above with reference to step 204, the supporting portions 422 can be partially or fully removed to sever the substrate 418 into a plurality of individual thinned portions 420, one of which is depicted in FIG. 4E. For example, as shown, at least some of the individual thinned portions 420 may include the interconnects 412. For example, as shown in FIG. 4E, the supporting portions 422 are fully removed.

Alternative to the maskless process depicted in FIGS. 4A-E, a method similar to the method described above may be utilized with a maskless process as depicted in FIGS. 5A-E. The exemplary process as depicted in FIGS. 5A-E discloses the stages of formation of an interconnect structure using a maskless process. For example, a substrate 500 may include one of a semiconductor material, such as silicon and/or other semiconductor materials, or a dielectric material, such as glass and/or other dielectric materials.

Figure 5A:
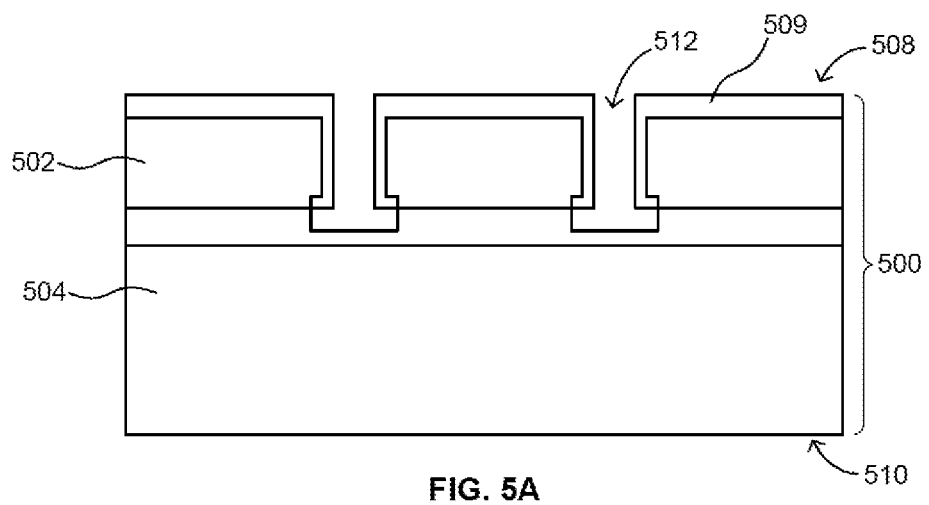
FIGS. 5A-E depict the stages of forming a microelectronic assembly in accordance with some embodiments of the present invention.
Figure 5B:
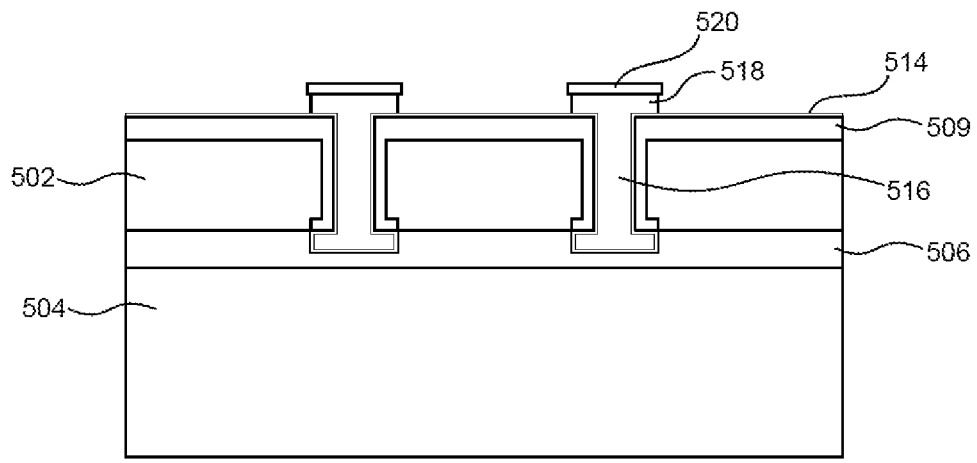

FIG. 5A depicts the substrate 500 including a first element 502 and a second element 504. The substrate 500 may be formed by bonding confronting surfaces of the first and second elements 502, 504 with one another. In one embodiment, the confronting surface of the first and second elements 502, 504 may be bonded through a dielectric layer 506. The substrate 500 may include a first surface 508 of the first element 502 opposite the confronting surface of the first element 502 and a second surface 510 of the second element opposite the confronting surface of the second element 504. A dielectric layer 509 may be overlying the first surface 508 and the surfaces of openings 512. The openings 512 may be formed in the first element 502, and may extend in a direction of thickness of the first element 502 and at least partially through the dielectric layer 506. In one embodiment, and as shown in FIGS. 5A-B, the openings 512 may extend laterally into the dielectric layer 506. A layer 514 may be overlying the dielectric layer 509 and the surfaces of the openings 512. The layer 514 may be one or more of a dielectric layer, barrier layer, adhesive layer, or combination thereof. The layer 514 may comprise one or more materials, such as one or more materials disclosed above for layer 410.

Disposed in the openings 512 and overlying the surfaces of the layer 514 within the openings 512 may be interconnects 516. The interconnects 516 may be formed from one or more conductive materials, such as one or more materials disclosed above for interconnects 412. Overlying the interconnects 516 and portions of the layer 514 may be electrically conductive contacts 518, each contact 518 in electrical communication with a corresponding interconnect 516. The contacts 518 may be capped with a capping layer 520. The capping layer 520 may be formed from the same material as the barrier layer 514 or another suitable material to cover the surfaces of the contacts 518. In one embodiment, the contacts 518 can be bond pads having connections to the interconnects 516 through back end of line (BEOL) wiring layers within interlayer dielectric (ILD) layers overlying the first surface 508 of the first element 502.

Figure 5C:
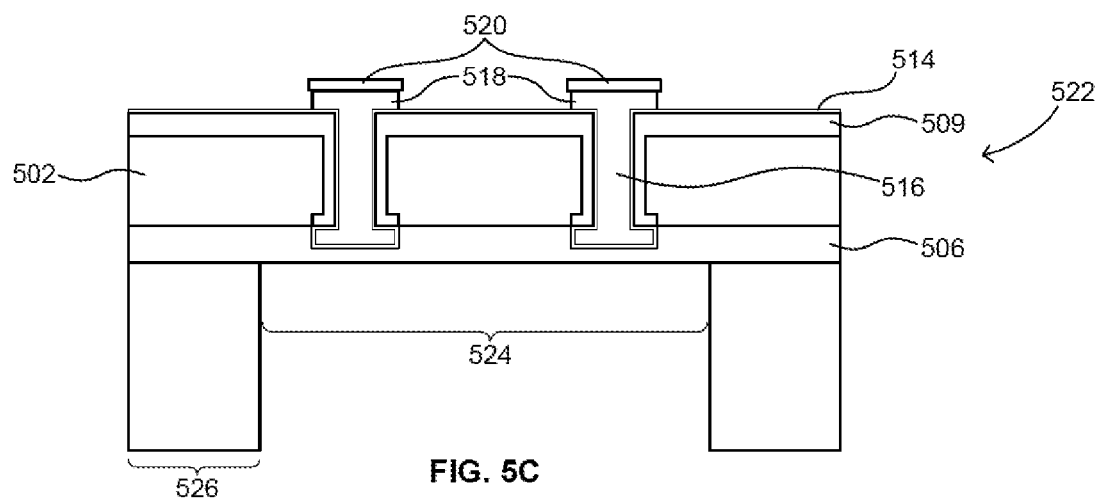
Figure 5D:
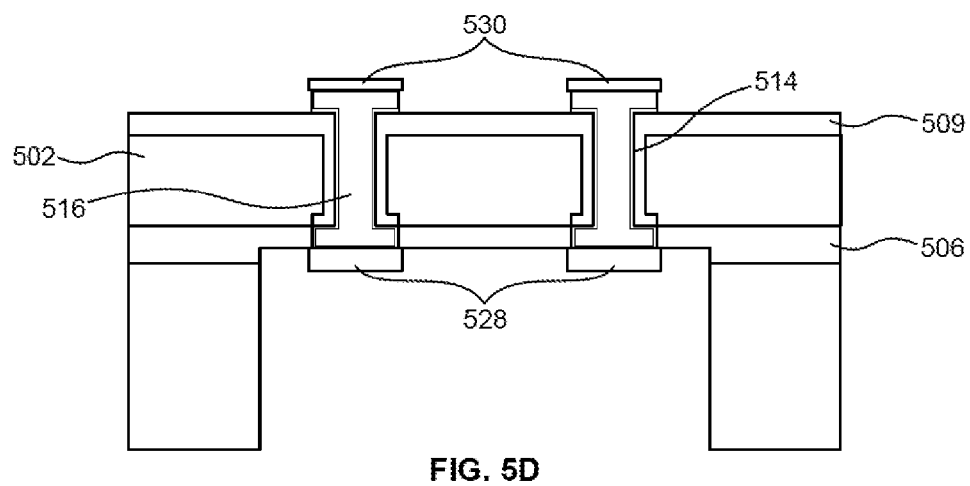

Similar to the method described above with reference to step 202, material exposed at portions of the second surface 510 may be removed to form a processed substrate 522 as depicted in FIG. 5C. The processed substrate 522 may include a plurality of thinned portions 524 (one such portion is shown in FIG. 5C) separated by integral supporting portions 526 of the processed substrate 522 having a thickness greater than the thickness of the thinned portions 524. Upon removal of material at portions of the second surface 510, barrier layer 514 lining the openings 512 and the dielectric layer 506 may be exposed at the second surface 510 as depicted in FIG. 5C. The removal of material may be performed by any suitable processes, such as reactive ion etch (RIE) processes, or the like.

After removal of material, a removal step may be implemented to remove the capping layer 520, and exposed portions of the barrier layer 514 at the first and second surfaces 508, 510, thereby exposing the interconnects 516 at the second surface 510 and the contacts 518 at the first surface 508. Electrically conductive structures 528, 530 may be formed at at least some of the interconnects 516 at the second surface 510 and at at least some of the contacts 518, respectively, the conductive structures 528, 530 in electrical communication with the interconnects 516.

Figure 5E:
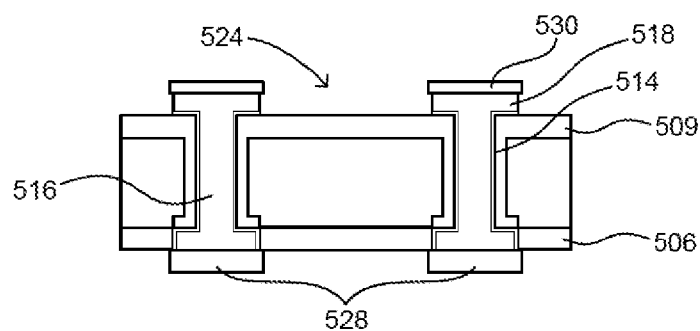

Similar to the method described above with reference to step 204, the supporting portions 526 can be partially or fully removed to sever the substrate 522 into a plurality of individual thinned portions 524, one of which is depicted in FIG. 5E. For example, as shown, at least some of the individual thinned portions 524 may include the interconnects 516. For example, as shown in FIG. 5E, the supporting portions 526 are fully removed.

Figure 6:
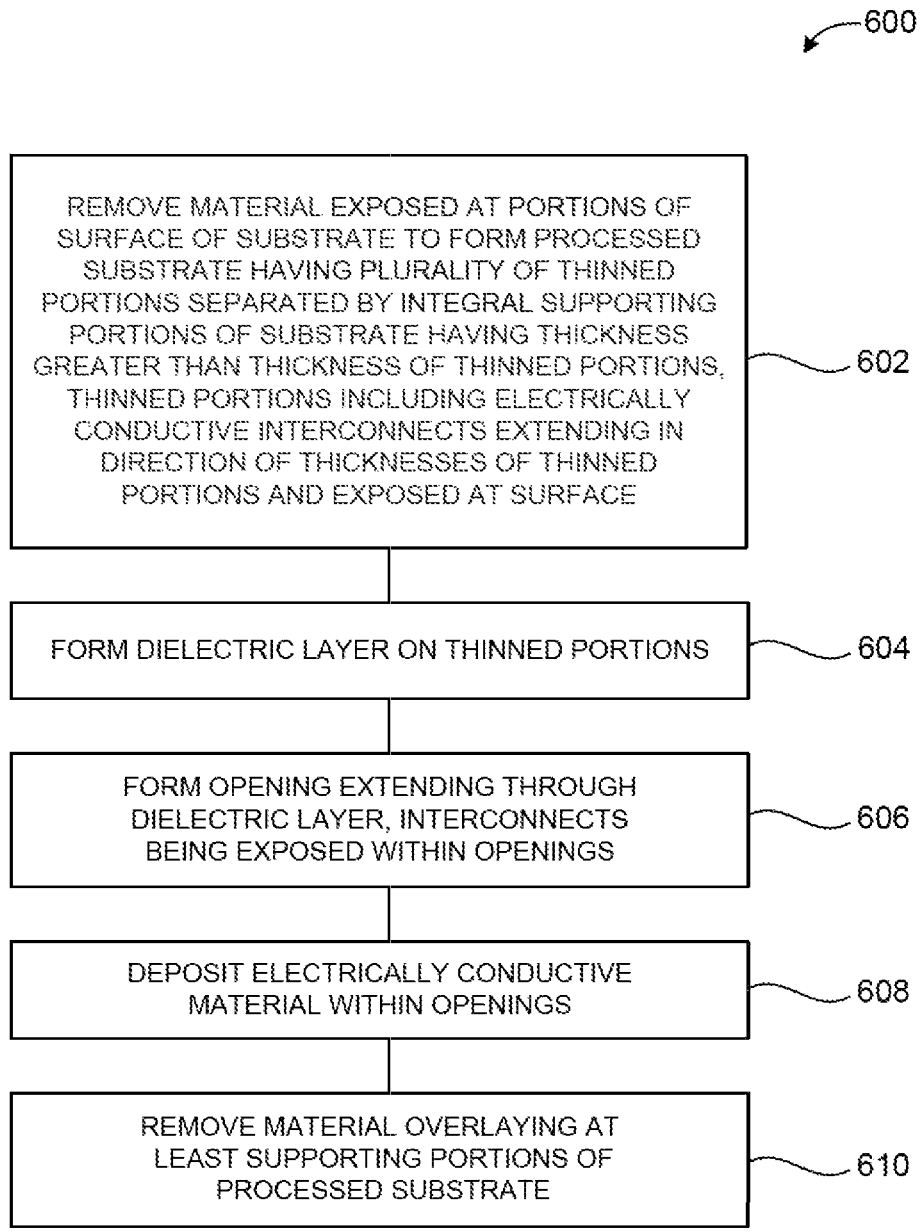
FIG. 6 depicts a flow chart for a method of forming a microelectronic assembly in accordance with some embodiments of the present invention.

FIG. 6 depicts a flow chart of a method 600 for formation of a microelectronics assembly in accordance with some embodiments of the present invention. The method 200 is described in accordance with exemplary processes depicted in FIGS. 3, 7-9.

Portions of the method 600 may be similar to, or the same as, the method 200. For example, method step 602 has already been described above with regard to FIGS. 3A-B and is substantially similar to method step 202. Accordingly, the method 600 will be described below using certain elements already discussed above with regards to FIGS. 3A-B and with further reference to FIGS. 6 and 7A-I.

Figure 7A:
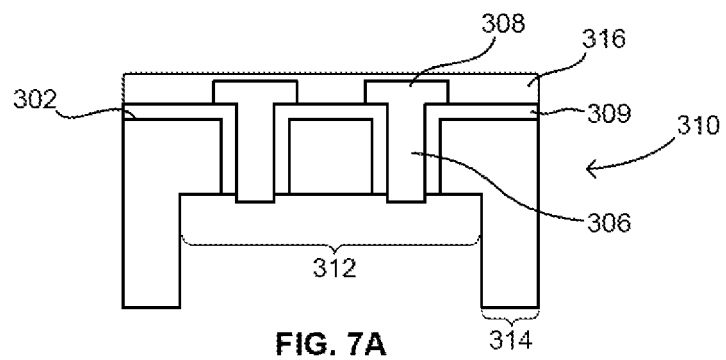
FIGS. 7A-I depict the stages of forming a microelectronic assembly in accordance with some embodiments of the present invention.

After the material has been removed from the second surface 304, as illustrated in FIG. 3B, the protective layer 316 may be formed overlying the first surface 302 to protect exposed surfaces of the contacts 308 as depicted in FIG. 7A.

Figure 7B:
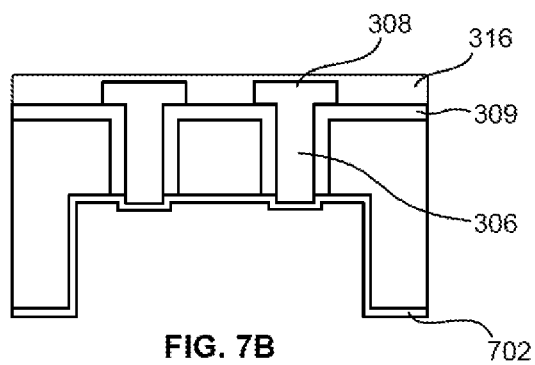
Figure 7C:
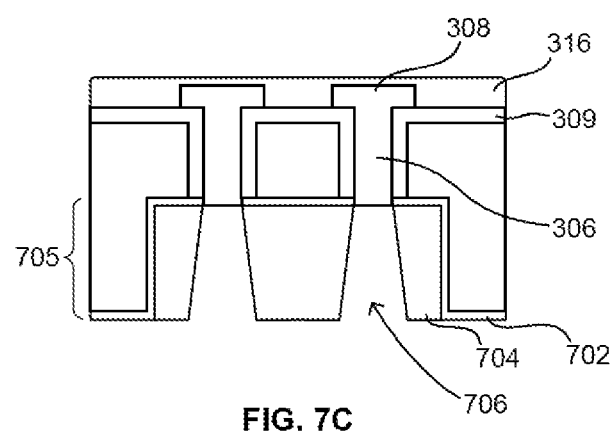

At 604, with the protective layer 316 covering the exposed surfaces of the contacts 308, a dielectric passivation layer 702 may be formed overlying the second surface 304 of the thinned portions 312 including exposed portions of the interconnects 306 exposed at the second surface 304 as depicted in FIG. 7B. The dielectric passivation layer 702 may also be formed overlying surfaces of the support portions 314. In one example, the dielectric passivation layer 702 may be formed of $SiO_2$, SiN, silicon oxynitride (SiON), silicon carbide (SiC), or any suitable combination thereof. The dielectric passivation layer 702 may be formed by PECVD at temperatures ranging from about 90 to about 300 degrees Celsius. After formation of the dielectric passivation layer 702, a second dielectric layer 704 may be formed overlying the surfaces of the dielectric passivation layer 702. The second dielectric layer 704 may be any suitable dielectric material, such as one or more of a photoresist, a photoimageable polymer, benzocyclobutane (BCB), polyimide, photosensitized epoxy, or other photosensitized polymers. In one embodiment, and as illustrated in FIG. 7C, the second dielectric layer 704 may fill a region 705 overlying the dielectric passivation layer 702 at the second surface 304 and extending in the direction of the supporting portions 314. It is noted that the FIG. 7c is illustrative and not to scale. Thus, the region 705 may have a low aspect ratio, such as about 100 to about 500 microns in depth to a width of about 3 to about 20 millimeters.

At 606, openings 706 may be formed, the openings 706 extending through the second dielectric layer 704 and the dielectric passivation layer 702. The interconnects 306 may be exposed at the second surface 304 and within the openings 706. The openings 706 may be formed by any suitable process, such as photolithography, laser ablation, or milling, among other processes.

Figure 7D:
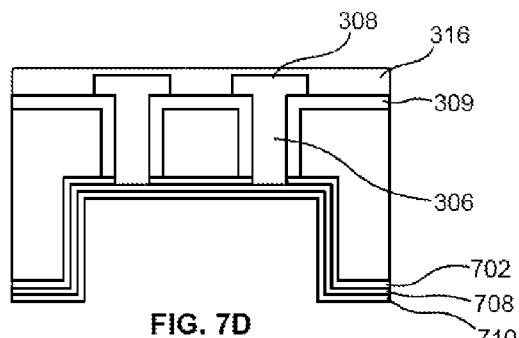

After exposing the interconnects 306 at the second surface 304, the second dielectric layer 704 may be removed. Optionally, after removing portions of the dielectric overlying the interconnects 306, a metal layer 708 may be formed overlying the dielectric passivation layer 702 and in conductive communication with the interconnects 306 as depicted in FIG. 7D. The metal layer 708 may comprise at least one of an adhesion layer, a barrier layer, or a seed layer.

At 608, an electrically conductive material 710 may be deposited within the openings 706. In one embodiment, as illustrated in FIG. 7D, the electrically conductive material 710 may be deposited above the dielectric passivation layer 702 and within the openings 706. In one embodiment, as illustrated in FIG. 7D, the electrically conductive material 710 may be overlying the metal layer 708. The electrically conductive material 710 may be in electrical communication with the interconnects 306.

Figure 7E:
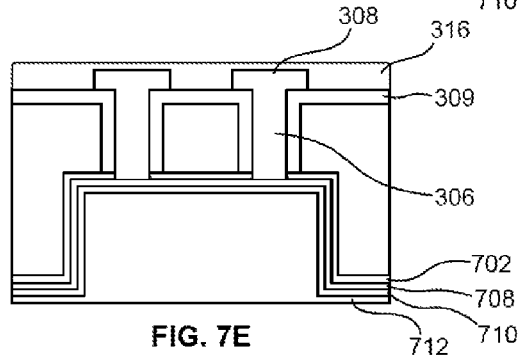
Figure 7F:
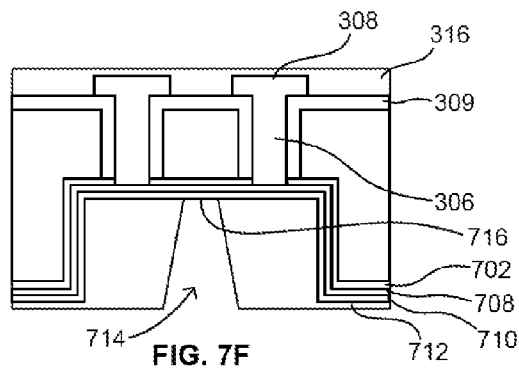
Figure 7G:
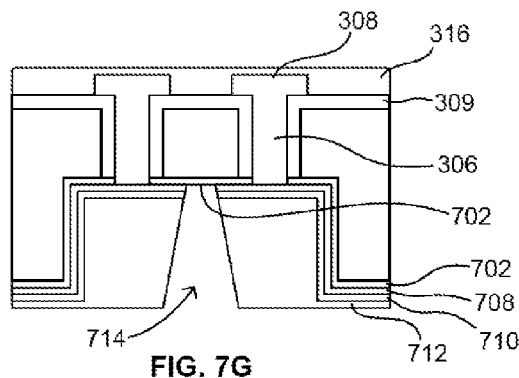

In one embodiment, such as illustrated in FIG. 7E, a third dielectric layer 712 may be formed overlying the electrically conductive material 710. Second openings 714 may be formed in the third dielectric layer 712, where the second openings 714 extend through the third dielectric layer 712, such as depicted in FIG. 7F. The second openings 714 overlying a portion 716 of the electrically conductive material 710 exposed within the second openings 714. The portion 716 may be removed as illustrated in FIG. 7G exposing the dielectric layer 702 at the second surface 304. The portion 716 may be removed to electrically isolate the interconnects 306 from each other. In one embodiment, the third dielectric layer 712 may be a self-planarizing dielectric layer.

Figure 7H:
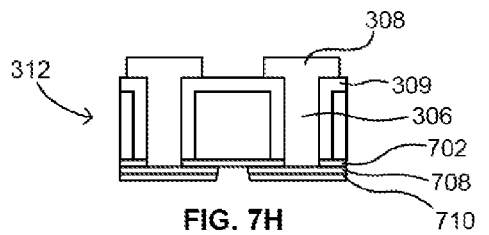

At 610, material overlying at least supporting portions 314 of the processed substrate may be removed so as to planarize a surface of the dielectric layer (such as a surface of the third dielectric layer 712 overlying the thinned portion 312) relative to at least one of the supporting portions or material of the processed substrate overlying the supporting portions. For example, material overlying at least supporting portions may include one or more portions of the dielectric passivation layer 702, metal layer 708, electrically conductive material 710, and the third dielectric layer 712. In one embodiment, the third dielectric layer 712 disposed above the thinned portion 312 of the processed substrate may be removed. In one embodiment, the protective layer 316 may be removed to expose the contacts 308. As depicted in FIG. 7H, after the removal of materials overlying the supporting portions, the supporting portions 314 can be partially or fully removed to sever the substrate 310 into a plurality of individual thinned portions 312, one of which is depicted in FIG. 7H. As shown, at least some of the individual thinned portions 312 may include the interconnects 306. In one embodiment, as shown in FIG. 7H, the supporting portions 314 may be fully removed when the processed substrate 310 is severed.

Figure 7I:
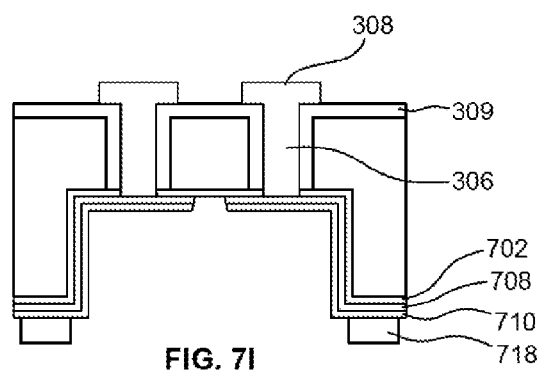

Alternatively, the supporting portions 314 may be partially removed as depicted in FIG. 7I. For example, alternative to the structure depicted in FIG. 7H, in one embodiment, at step 610, the electrically conductive material 710 may remain overlying the supporting portions 314 when materials are removed, such as the third dielectric layer 712 as illustrated in FIG. 7I. Contacts 718, such as bond pads or the like, may be formed atop portions of the electrically conductive material 710 overlying the supporting portions 314. For example, after formation of the contacts 718, portions of the supporting portions 314 can be removed to sever the processed substrate 310 into a plurality of individual thinned portions 312 which include portions of supporting portions 314, one of which is depicted in FIG. 7I. The contacts 718 may be used for assembly, electrical communication, or mechanical attachment to other structures.

Figure 8A:
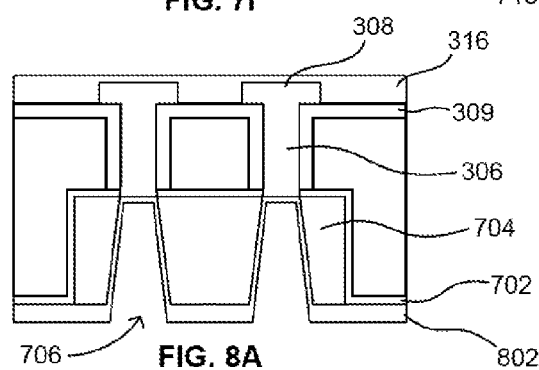
FIGS. 8A-D depict the stages of forming a microelectronic assembly in accordance with some embodiments of the present invention.

Alternatively, other microelectronic assemblies may be formed utilizing one or more methods similar to the method 600 described above. For example, following the method steps shown from FIGS. 7A-D, a method may proceed to method steps depicted in FIG. 8A, where a metal layer 802 may be formed overlying the surfaces of the second dielectric layer 704, such as depicted in FIG. 8A. The metal layer 802 may include one or more of an adhesive layer, barrier layer, or a seed layer. The metal layer 802 may be in conductive communication with the interconnects 306.

Figure 8B:
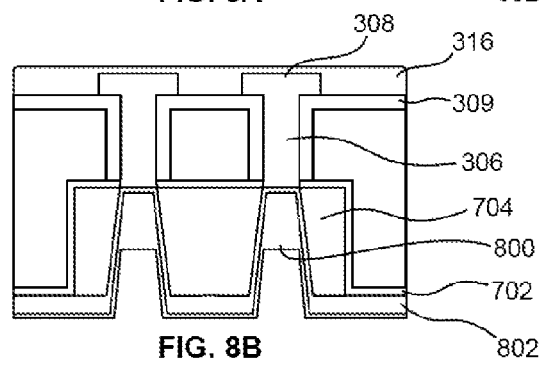

Similar to the method described above with reference to step 608, an electrically conductive material 800 may be disposed within the openings 706 and above surfaces of the second dielectric layer 704. The electrically conductive material 800 may be deposited on the surfaces of the metal layer 802 and within the openings 706. In one embodiment, such as depicted in FIG. 8B, the electrically conductive material 800 may fill the openings 706 up to a desired level. The desired level may be less than the total size of the openings 706. The electrically conductive material 800 may be any suitable conductive material, for example, such as solder material, plated material, such as electroplated or electroless plated, or other materials.

Figure 8C:
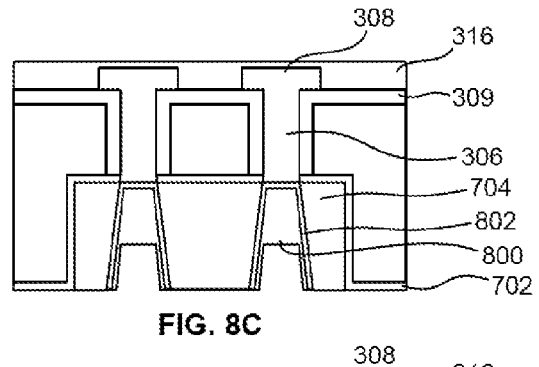
Figure 8D:
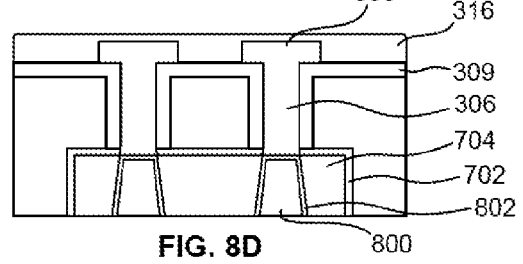

Similar to the method described above with reference to step 610, material overlying at least supporting portions 314 of the processed substrate may be removed so as to planarize a surface of the dielectric layer (such as a surface of the second dielectric layer 704 overlying the thinned portion 312) relative to at least one of the supporting portions or material of the processed substrate overlying the supporting portions. In one embodiment, portions of the electrically conductive material 800 may be removed from the supporting portions 314 and surfaces of the second dielectric layer 704 not including the surfaces of the openings 706, such as depicted in FIG. 8C. After, or concurrently with, removing the portions of the electrically conductive material 800, portions of the metal layer 802, the supporting portions 314, and the second dielectric layer 704 may be removed, such as by processes including one or more of grinding, lapping, chemical mechanical planarization (CMP) or other processes. In one embodiment, such as depicted in FIG. 8D, the removal of material may continue up to about the point at which the desired level of the electrically conductive material 800 within the openings 706 is reached. After removal of material at 610, a portion of the second dielectric layer 704 remains as depicted in FIG. 8D. Further, the protective layer 316 may be removed at 610, or during a subsequent process step. The substrate 310 may be severed by removing a portion of the supporting portions 314 such that at least some supporting portions are attached to each individual thinned portion 312 after severing the substrate 310 as depicted in FIG. 8D.

Figure 9A:
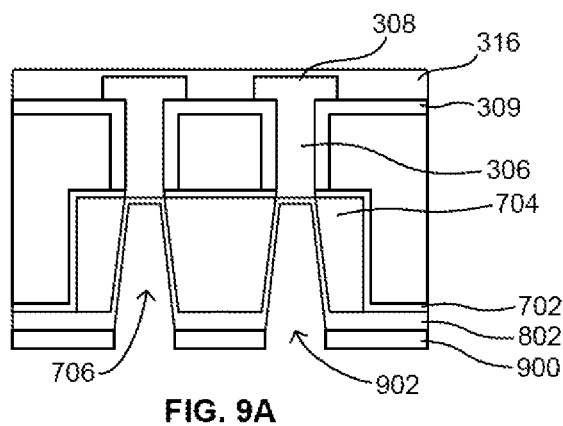
FIGS. 9A-F depicts the stages of forming a microelectronic assembly in accordance with some embodiments of the present invention.
Figure 9B:
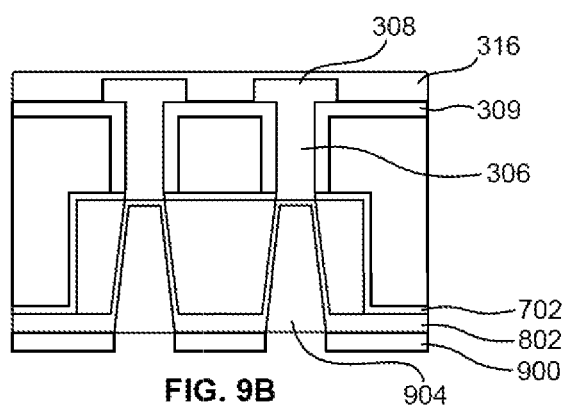

Alternatively, other microelectronic assemblies may be formed utilizing a method similar to method 600. For example, following the method steps shown from FIGS. 7A-C, and 8A, the method may proceed to a process step depicted in FIG. 9A, where a resist layer 900 may be deposited above portions of the supporting portions 314, the metal layer 802, and the second dielectric layer 704. The resist layer 900 may have openings 902 aligned with the openings 706. An electrically conductive material 904 may be deposited through the openings 902 and within the openings 706 as depicted in FIG. 9B. The electrically conductive material 904 may be substantially similar to the electrically conductive material 800.

Figure 9C:
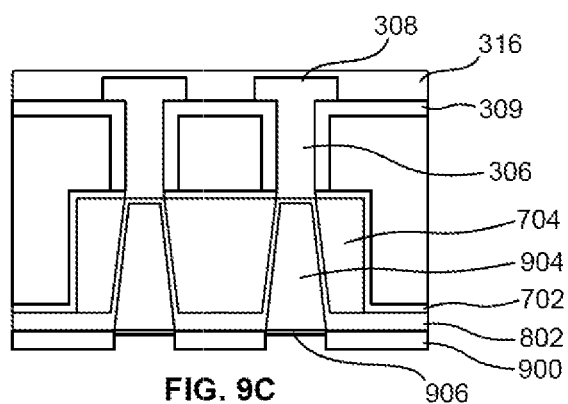
Figure 9D:
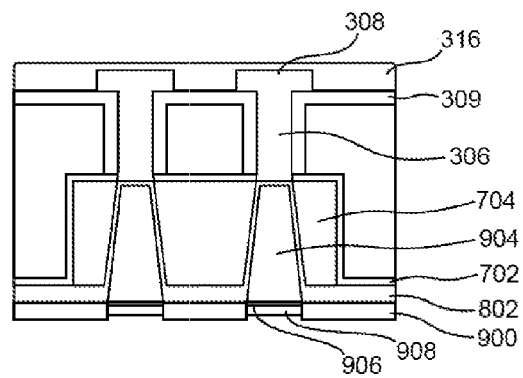

With the resist layer 900 still in place, a barrier layer 906 may be formed overlying the electrically conductive material 904 and within the openings 902 as depicted in FIG. 9C. The barrier layer 906 may include one or more materials, for example, such as materials discussed above for use in barrier layers, or other materials. A bond metal material may be deposited overlying the barrier layer 906 and within the openings 902 to form contacts 908 as depicted in FIG. 9D. The contacts 908 may be in conductive communication with the electrically conductive material 904. The bond metal material may be solder or other bond metal materials.

Figure 9E:
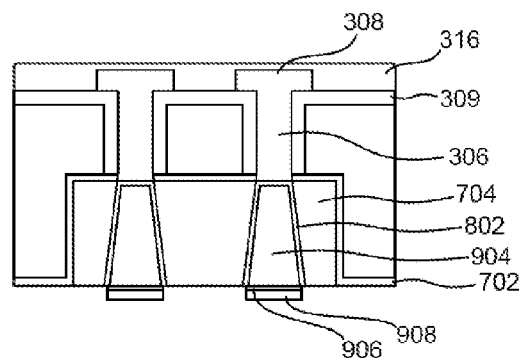

Similar to the method described above with reference to step 610, material overlying at least supporting portions 314 of the process substrate may be removed so as to planarize a surface of the dielectric layer (such as a surface of the second dielectric layer 704 overlying the thinned portion 312) relative to at least one of the supporting portions or material of the processed substrate overlying the supporting portions. The resist layer 900 may be removed. After, or concurrently with, removing resist layer 900, one or more of portions of the metal layer 802, the supporting portions 314, and the second dielectric layer 704 may be removed. In one embodiment, such as depicted in FIG. 9E, the removal of material may continue up to about the point at which the level of the contacts 908 extend beyond the supporting portions 314. After removal of material at 610, a portion of the second dielectric layer 704 remains.

Figure 9F:
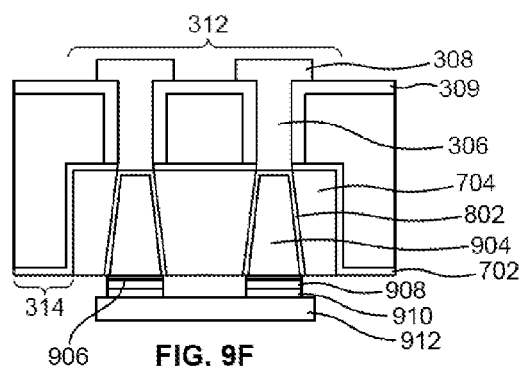
Figures 1, 9F:
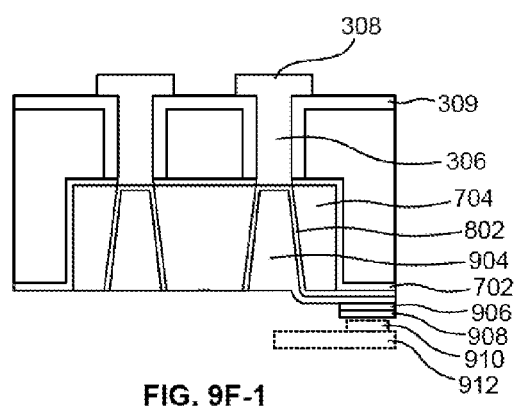

After removal of materials, contacts 910 exposed at a surface of a microelectronic element 912 juxtaposed with the substrate contacts 908 of the processed substrate may be joined, such as depicted in FIG. 9F.

Before or after joining the microelectronic element 910 with the process substrate, the protective layer 316 may be removed to expose the contacts 308. Subsequently, the substrate may be severed by removing a portion of the supporting portions 314 such that at least some supporting portions are attached to each individual thinned portion 312 after severing the substrate 310, such as depicted in FIG. 9F.

Alternative to, or in combination with, the structure depicted in FIG. 9F, other structures are possible, such as the structure depicted in FIG. 9F-1. For example, by utilizing additional process steps prior to severing the substrate, the electrically conductive material 904, such as an RDL or Back End of Line (BEOL) structure, may be extended above portions of the supporting portions 314, on any other surface of the semiconductor, passivation layer 702, dielectric layer 704, and/or any other layer described herein. The barrier layer 906 may be formed overlying the supporting portions 314 and the contacts 908 may be formed overlying the barrier layer 906 as depicted in FIG. 9F-1.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a microelectronic assembly, comprising:
    removing material exposed at portions of a surface of a substrate to form a processed substrate having a plurality of thinned portions separated by integral supporting portions of the processed substrate, each of the integral supporting portions having a width and a first thickness extending along the entire width, wherein the first thickness is greater than a thickness of the thinned portions, at least some of the thinned portions each including a plurality of electrically conductive interconnects extending in a direction of the thicknesses of the thinned portions and exposed at the surface; and
    removing fully the integral supporting portions of the substrate to sever the substrate into a plurality of individual thinned portions, each individual thinned portion having a thickness less than the first thickness, at least some individual thinned portions including the interconnects.

2. The method of claim 1, wherein the substrate consists essentially of semiconductor material and the removing material to form the processed substrate comprises removing some of the semiconductor material, the method further comprising forming a dielectric layer overlying the surface of the thinned portions prior to the step of removing the integral supporting portions.

3. The method of claim 1, wherein the substrate consists essentially of a dielectric material which insulates the interconnects from one another, and the removing material to form the processed substrate comprises removing some of the dielectric material which insulates the interconnects.

4. The method of claim 1, further comprising forming the substrate by steps including:
    bonding confronting surfaces of first and second elements with one another and forming the interconnects extending through the first element, wherein the step of removing material of the substrate includes removing the material of the second element exposed at the portions of the surface to cause the electrically conductive interconnects to become exposed at the surface.

5. The method of claim 1, wherein at least some of the thinned portions each include a plurality of active devices.

6. The method of claim 2, further comprising:
    forming an electrically conductive structure contacting at least some of the interconnects prior to the step of removing the supporting portions, wherein the electrically conductive structure is exposed at the surface.

7. The method of claim 1, wherein during the step of removing material at the surface of the substrate, at least some of the thinned regions are formed so as to leave supporting portions surrounding the at least some thinned regions.

8. The method of claim 1, wherein the step of removing the integral support portions further comprises:
    sawing at least one first supporting portion of the substrate in a first direction and sawing at least one second supporting portion of the substrate in a second direction transverse to the first direction.

9. A method of forming a microelectronic assembly, comprising:
    removing material exposed at portions of a surface of a substrate to form a processed substrate having a plurality of thinned portions separated by integral supporting portions of the processed substrate, each of the integral supporting portions having a width and a first thickness extending along the entire width, wherein the first thickness is greater than a thickness of the thinned portions, at least some of the thinned portions each including a plurality of electrically conductive interconnects extending in a direction of the thicknesses of the thinned portions and exposed at the surface;
    removing fully the integral supporting portions of the substrate to sever the substrate into a plurality of individual thinned portions, each individual thinned portion having a thickness less than the first thickness, at least some individual thinned portions including the interconnects; and
    forming an electrically conductive structure contacting at least some of the interconnects prior to the step of removing the integral supporting portions, wherein the electrically conductive structure is exposed at the surface.

10. The method of claim 9, wherein the substrate consists essentially of semiconductor material and the removing material to form the processed substrate comprises removing some of the semiconductor material, the method further comprising forming a dielectric layer overlying the surface of the thinned portions prior to the step of removing the integral supporting portions.

11. The method of claim 9, wherein the substrate consists essentially of a dielectric material which insulates the interconnects from one another, and the removing material to form the processed substrate comprises removing some of the dielectric material which insulates the interconnects.

12. The method of claim 9, further comprising forming the substrate by steps including:

bonding confronting surfaces of first and second elements with one another and forming the interconnects extending through the first element, wherein the step of removing material of the substrate includes removing the material of the second element exposed at the portions of the surface to cause the electrically conductive interconnects to become exposed at the surface.

13. The method of claim 9, wherein at least some of the thinned portions each include a plurality of active devices.

14. The method of claim 9, wherein during the step of removing material at the surface of the substrate, at least some of the thinned regions are formed so as to leave supporting portions surrounding the at least some thinned regions.

15. The method of claim 9, wherein the step of removing the integral support portions further comprises:
sawing at least one first supporting portion of the substrate in a first direction and sawing at least one second supporting portion of the substrate in a second direction transverse to the first direction.

* * * * *